(12) United States Patent
Ou (10) Patent No.: US 8,456,239 B2
(45) Date of Patent: Jun. 4, 2013

(54) AMPLIFYING UNIT, POWER AMPLIFIER AND TRANSMITTER

(75) Inventor: Jian Ou, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 13/486,916

(22) Filed: Jun. 1, 2012

(65) Prior Publication Data

US 2012/0236963 A1 Sep. 20, 2012

Related U.S. Application Data

(63) Continuation of application No. PCT/CN2011/072700, filed on Apr. 13, 2011.

(30) Foreign Application Priority Data

Apr. 14, 2010 (CN) .......................... 2010 1 0155306

(51) Int. Cl.
 *H03F 3/68* (2006.01)
(52) U.S. Cl.
 USPC ......... 330/295; 330/302; 330/277; 330/124 R
(58) Field of Classification Search
 USPC .............................. 330/295, 302, 277, 124 R
 See application file for complete search history.

(56) References Cited

U.S. PATENT DOCUMENTS

| | | | | |
|---|---|---|---|---|
| 5,726,540 A | * | 3/1998 | Klink | 315/383 |
| 5,835,161 A | * | 11/1998 | Keller | 348/674 |
| 6,052,027 A | * | 4/2000 | Candy | 330/260 |
| 6,084,475 A | | 7/2000 | Rincon-Mora | |
| 6,442,008 B1 | * | 8/2002 | Anderson | 361/56 |
| 6,882,178 B2 | * | 4/2005 | Nishino et al. | 326/66 |
| 7,126,427 B2 | * | 10/2006 | Aoki | 330/311 |
| 2007/0085608 A1 | | 4/2007 | Iriguchi et al. | |
| 2007/0146020 A1 | * | 6/2007 | Williams | 327/110 |
| 2011/0096240 A1 | | 4/2011 | Moonen et al. | |

FOREIGN PATENT DOCUMENTS

| | | |
|---|---|---|
| CN | 1471261 | 1/2004 |
| CN | 1941615 | 4/2007 |
| CN | 101204009 | 6/2008 |
| CN | 101860330 | 9/2012 |

OTHER PUBLICATIONS

Written Opinion of the International Searching Authority issued Jun. 23, 2011 in corresponding International Patent Application No. PCT/CN2011/072700.

* cited by examiner

*Primary Examiner* — Patricia Nguyen
(74) *Attorney, Agent, or Firm* — Staas & Halsey, LLP (57) ABSTRACT

A power amplifier, which includes n+1 amplifying units coupled in parallel, where n is an integer greater than or equal to 0, third input ends VR(i) of the n+1 amplifying units are coupled to a power input $V_L$, output ends D(i) of the n+1 amplifying units are coupled to a power input $V_H$, and an output power of the power amplifier is in an increasing function relationship with a capacitance value obtained through accumulation of energy returning capacitors xC of the n+1 amplifying units. The power amplifier changes circuit impedance in a manner of controlling the parallel capacitance value by a switching digital signal, thereby controlling a magnitude of a returned power value and forming different output powers.

10 Claims, 5 Drawing Sheets

AMPLIFYING UNIT, POWER AMPLIFIER AND TRANSMITTER

CROSS-REFERENCE TO RELATED APPLICATIONS

This application is a continuation of International Application No. PCT/CN2011/072700, filed on Apr. 13, 2011, which claims priority to Chinese Patent Application No. 201010155306.6, filed on Apr. 14, 2010, both of which are hereby incorporated by reference in their entireties.

FIELD OF THE APPLICATION

The present application relates to the field of mobile communications, and in particular, to an amplifying unit, a power amplifier and a transmitter.

BACKGROUND OF THE APPLICATION

A base station transceiver is one of important components of a mobile communication network. The function of the transmitter part of the base station transceiver is to convert a signal that is modulated and carries information into a high-power radio-frequency signal, which is transmitted through a subsequent antenna. The base station transceiver is developing towards smaller volume, lower power consumption and higher communication speed.

In the base station transceiver, a power amplifier (briefly referred to as PA), as one of core components, functions to amplify a signal to a sufficient power level, so as to achieve transmission, long-distance transport and reliable reception of the signal. In the power consumption of the whole base station transceiver, the power consumption of the power amplifier accounts for 40%, and the working efficiency of the power amplifier is generally 30% to 40%, therefore, how to improve the working efficiency of the power amplifier while ensuring the linearity of the power amplifier is a research focus of the industry.

Figure 1:
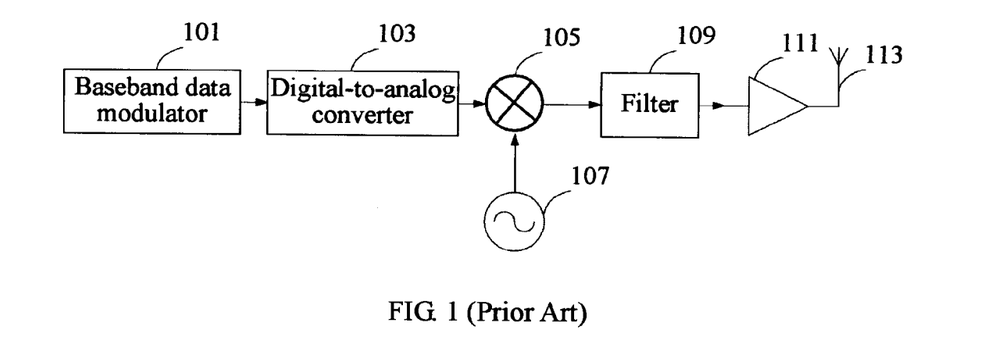
FIG. 1 is a schematic structural diagram of a transmitter in the prior art.

FIG. 1 is a schematic structural diagram of a transmitter in the prior art. In FIG. 1, a baseband data modulator 101 modulates a digital signal to be sent into a specific waveform signal which meets radio frequency transmission requirements; and the specific waveform signal is converted into an actual analog waveform signal through a digital-to-analog converter (DAC) 103. As the working frequency of the digital-to-analog converter is low, the frequency of the output signal generally cannot meet requirements of the frequency band of the transmitter, and therefore, an intermediate-frequency signal which has low frequency and is output by the digital-to-analog converter is further modulated onto a carrier frequency through a mixer 105 and a local oscillator 107, that is, the signal frequency is increased to the carrier frequency meeting the requirements. A redundant signal generated in the frequency increasing process is filtered out through a filter 109. Finally, after the power amplifier 111 amplifies the signal to a power meeting the requirements of the frequency band of the transmitter, and the signal is then transmitted through an antenna 113.

The basic idea of the transmitter of such a structure is to complete digital signal processing at the baseband part, convert a digital signal to an analog signal through digital-to-analog conversion, and then transmit the analog signal after up conversion and power amplification.

The digital-to-analog converter (DAC) 103 is a bottleneck of the design of the transmitter. As the working frequency of the DAC is limited, a circuit such as an up converter 105 needs to be additionally provided, which increases the complexity of the design of the transmitter. A corresponding high-performance clock circuit additionally provided for the DAC not only causes a high cost of the design of the transmitter, but also increases the technical implementation complexity of hardware. The up conversion circuit and the power amplifier generate a large amount of noise signals, and particularly the noise signal generated by the local oscillator is close to a useful signal, so that a narrow band filter needs to be additionally provided for filtering, which not only increases the cost, but also makes it technically difficult to implement a wideband transmitter.

How to overcome the bottleneck of the DAC, to directly convert a baseband digital signal to a radio-frequency power signal, so as to omit circuits such as the up converter and the local oscillator, and simplify the design of the transmitter, is a research focus of the industry.

Figure 2:
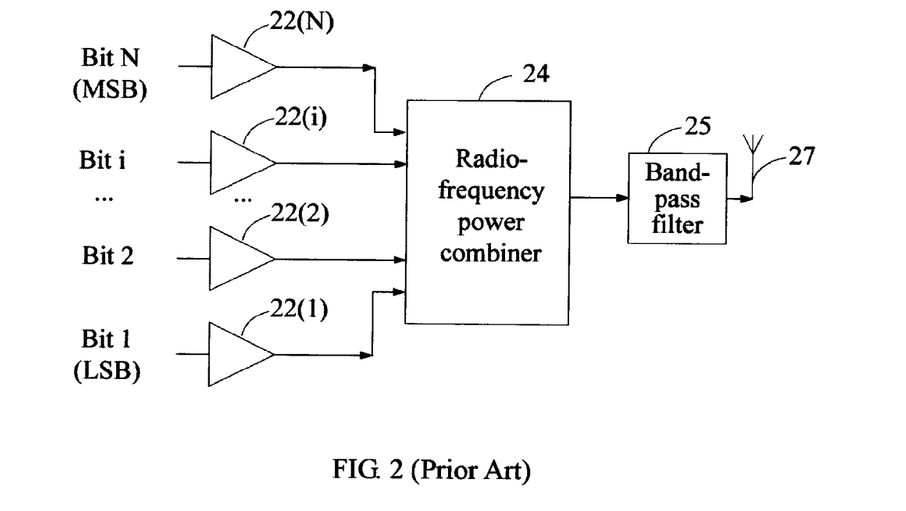
FIG. 2 is a schematic structural diagram of a digital transmitter in the prior art.

FIG. 2 is a schematic structural diagram of a digital transmitter in the prior art. For detailed introduction, see Patent Application No. WO 2008/150341. In such a transmitter structure, parallel digital radio-frequency signals are formed by N bits, from a least significant bit (Least Significant Bit, LSB) Bit 1 to a most significant bit (Most Significant Bit, MSB) Bit N. Each bit is input to one switching power amplifier 22. Output powers of all the switching power amplifiers are superimposed through a radio-frequency power combiner 24. Then, the radio-frequency signals go through a band-pass filter 25 and then sent to an antenna 27 for transmission. In such a design of the transmitter, power superimposition is performed through radio-frequency combination. The principle of the radio-frequency combination is that: for out-of-phase combination, the loss rate of the combiner is directly proportional to the number of branches, for example, for combination of 4 branches, signals to the output end are only a quarter of signals to the input end for any input port. It can be seen that, the power consumption is large, and the efficiency of the transmitter is not high.

SUMMARY OF THE APPLICATION

An embodiment of the present application provides an amplifying unit, which includes: a first input end B(i), a second input end R(i), a third input end VR(i) and an output end D(i), where a signal input to the second input end R(i) is an inverted signal of a signal input to the first input end B(i), and the amplifying unit further includes:

a first transistor T1, having a grid electrode coupled to the first input end B(i), a drain electrode coupled to the output end D(i), and a source electrode coupled to an energy returning capacitor xC, where the energy returning capacitor xC has one end coupled to the source electrode of the first transistor T1 and another end grounded; and a second transistor T2, having a grid electrode coupled to the second input end R(i), a source electrode coupled to the third input end VR(i) and an anode of a diode, and a drain electrode coupled to the source electrode of the first transistor T1 and a cathode of the diode.

An embodiment of the present application further provides a power amplifier, which includes n+1 abovementioned amplifying units coupled in parallel, where n is an integer greater than or equal to 0, the third input ends VR(i) of the n+1 amplifying units are coupled to a power input $V_L$, the output ends D(i) of the n+1 amplifying units are coupled to a power input $V_H$ through the resonant inductor L, and an output power of the power amplifier is in an increasing function relationship with a capacitance value obtained through accumulation of the energy returning capacitors xC of the n+1 amplifying units.

the power amplifier provided in the embodiment of the present application does not perform power superimposition in a manner of power combination, but changes circuit impedance in a manner of controlling the parallel capacitance value by a switching digital signal, so as to control a returned power value and form different output powers. The problem of power loss and low efficiency caused by power combination can be effectively resolved.

An embodiment of the present application further provides a transmitter, which includes a digital processing unit and a power supply unit, and the transmitter further includes the abovementioned power amplifier, where the power supply unit is coupled to the digital processing unit and the power amplifier, the power amplifier is configured to receive a digital signal input by the digital processing unit, output a radio-frequency signal after performing signal amplification and digital/analog conversion, and output a returned energy to the power supply unit.

BRIEF DESCRIPTION OF THE DRAWINGS

FIG. 3b is a simplified schematic diagram of the amplifying unit shown in FIG. 3a;

DETAILED DESCRIPTION OF THE EMBODIMENTS

The present application is illustrated in further detail below through specific embodiments with reference to the accompanying drawings. The exemplary embodiments of the present application and the illustration thereof are provided for ease of understanding of the innovative solutions of the present application, but should not be construed as unnecessary limitations to the protection scope of the present application.

For purposes of ease of illustration rather than limitation, the description of the following embodiments gives specific details such as a specific system structure, interface and technology, so as to facilitate thorough understanding of the present application. It is apparent to persons skilled in the art that, the present application may also be implemented in other embodiments departing from these specific details. In other cases, the detailed illustration of well-known devices, circuits and methods is omitted, so as to prevent unnecessary details from affecting the illustration of the present application. Moreover, various functions or unit blocks are given in some accompanying drawings. It is known to persons skilled in the art that, the functions may be implemented by using separate hardware circuits, or using a digital microprocessor with suitable programs or software for operation of general-purpose computer, or using an application specific integrated circuit (ASIC) and/or one or more digital signal processors (DSP/FPGA).

Figure 3A:
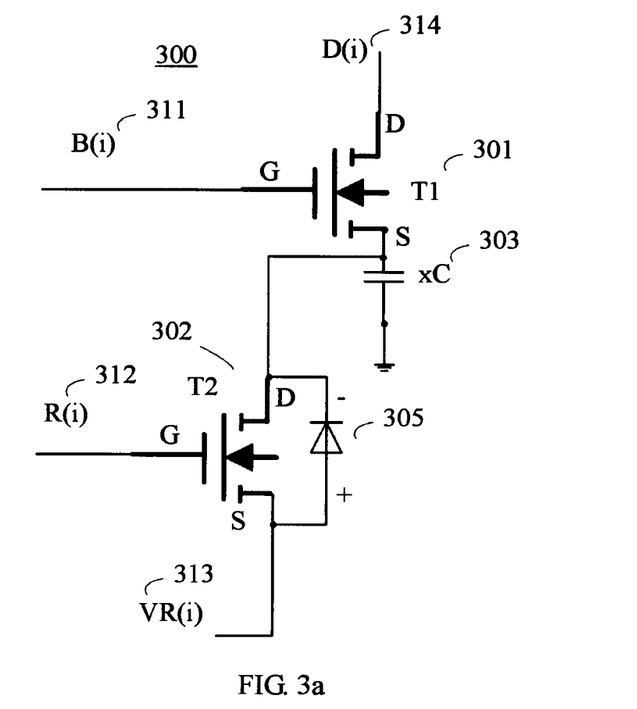
FIG. 3a is a schematic structural diagram of an amplifying unit according to an embodiment of the present application.

An embodiment of the present application provides an amplifying unit. FIG. 3a is a schematic structural diagram of an amplifying unit 300 according to an embodiment of the present application.

A signal input to B(i) (311) is a signal that may be represented by a binary digital switching signal. For example, B(i) is a high level or low level, or is 1 (representing the high level), or 0 (representing the low level). R(i) (312) is an inverted signal of B(i). For example, if B(i) is 1, R(i) is 0; or if B(i) is the high level, R(i) is the low level. A grid electrode (G) of a first transistor T1 (301) (or referred to as a power amplifier transistor) is coupled to B(i), a drain electrode (D) of the first transistor T1 (301) is coupled to an output D(i) (314) of an amplifier, and a source electrode (S) of the first transistor T1 (301) is coupled to a capacitor xC (303) (or referred to as an energy returning capacitor), and at the same time is coupled to a drain electrode (D) of a second transistor T2 (302) (or referred to as an energy returning transistor). x of the energy returning capacitor xC is a positive integer for representing that a capacitance value of the energy returning capacitor xC is a positive integral multiple of a preset capacity C. For example, 5 C represents a capacitance value being 5 times of the preset capacity. The energy returning capacitor xC has one end coupled to the source electrode (S) of the first transistor T1 and another end grounded. The second transistor T2 (302) has a grid electrode (G) coupled to R(i), a source electrode (S) coupled to VR(i) (313) and an anode of a diode 305, and a drain electrode (D) coupled to the source electrode (S) of the first transistor T1 and a cathode of the diode 305. VR(i) is a low-voltage power input, and is configured to charge the energy returning capacitor xC to an expected voltage through the diode 305, so as to ensure the accuracy of a working direct-current reference of the transistor T1. Optionally, both the first transistor and the second transistor work in an on/off state, without bias.

The first transistor and the second transistor are illustrated by taking field effect transistors for example, and persons of ordinary skill in the art can understand that, the first transistor and the second transistor may be various power amplifier transistors in industrial application, such as Gallium arsenide (GaAs), Heterojunction Bipolar Transistor (HBT), and LDMOS (laterally diffused metal oxide semiconductor) transistors. The first transistor and the second transistor may be of different types.

Figure 3B:
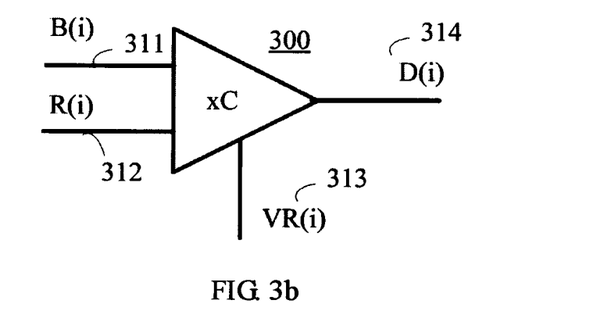

FIG. 3b is a simplified schematic diagram of the amplifying unit shown in FIG. 3a.

The amplifying unit shown in the figure includes a first input end B(i) (311), a second input end R(i) (312), a third input end VR(i) (313) and an output end D(i) (314). B(i) is controlled by a binary digital switching signal representing a signal amplitude. R(i) is an inverted signal of B(i). VR(i) is a low-voltage power input. D(i) is an output of the amplifying unit. A power of the amplifying unit may be represented by a function of xC, for example, P=f(C).

Figure 4:
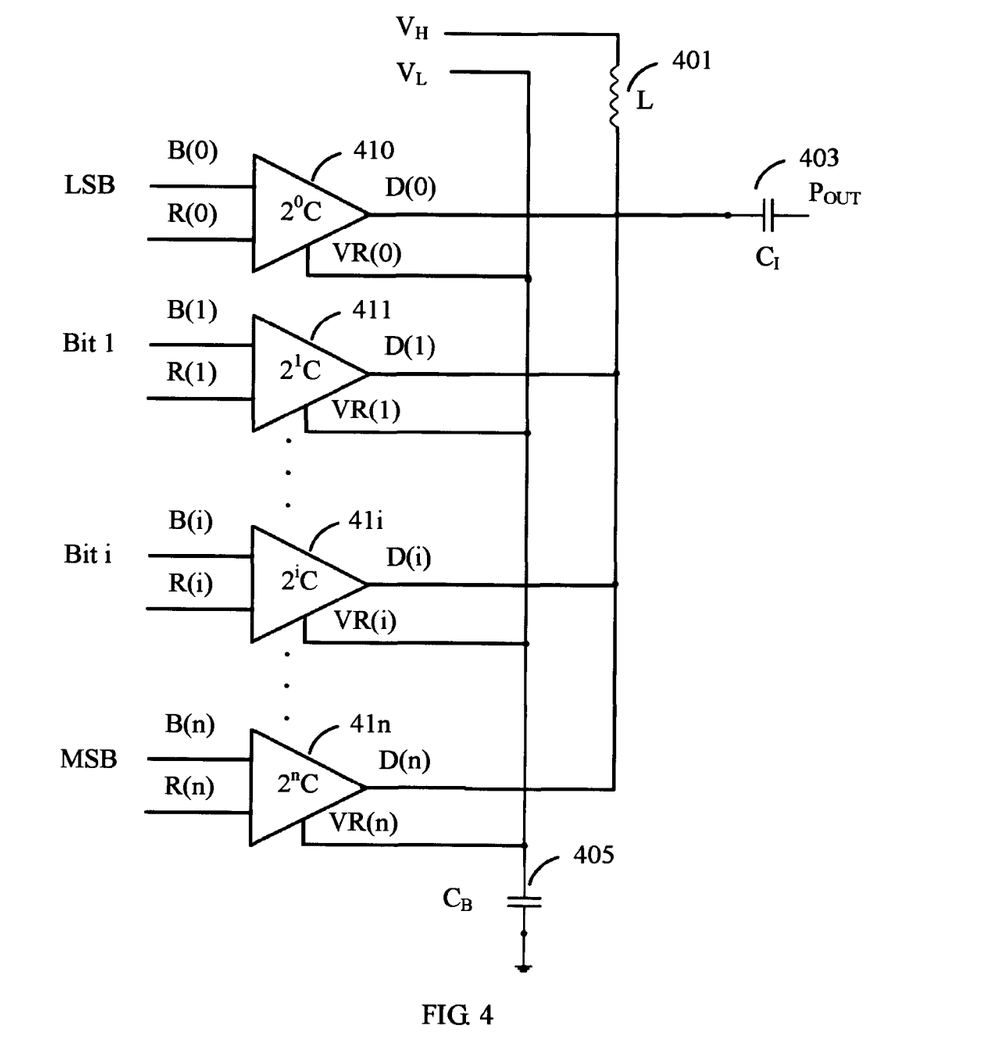
FIG. 4 is a schematic structural diagram of a power amplifier according to an embodiment of the present application.

FIG. 4 is a schematic structural diagram of a power amplifier according to an embodiment of the present application.

The power amplifier includes a plurality (greater than or equal to 1) of amplifying units (410, 411, ..., 41n) shown in FIG. 3b coupled in parallel. The parallel coupling is that: the third input end VR(i) (VR(0), VR(1), ..., VR(n)) of each amplifying unit is coupled to a power input $V_L$; and the output end D(i) of each amplifying unit is coupled to a power input $V_H$ and an output end $P_{OUT}$ of the power amplifier.

The third input end VR(i) of each amplifying unit and the power input $V_L$ may further be grounded through a capacitor $C_B$. The capacitor $C_B$ may be configured to absorb an energy returned by the amplifying units, so as to prevent abrupt change of $V_L$.

The output end D(i) of the amplifying unit may further be coupled to a high-voltage power input $V_H$ through a resonant inductor L (401). The resonant inductor L may have an energy storage function, store energy when the transistor is on and release the energy when the transistor is off, and may further form a resonant network with other passive elements (capacitors).

Optionally, the output end D(i) of the amplifying unit may further be coupled to the output end $P_{OUT}$ of the power amplifier through a direct-current blocking capacitor $C_I$ (403). The direct-current blocking capacitor $C_I$ may be configured to eliminate the influence of a direct-current signal on post-stage circuits.

The direct-current blocking capacitor $C_I$ may form a resonant network with other passive elements (inductors).

The output end D(i) of the amplifying unit outputs a radio-frequency switching signal, and through the cooperation of analog devices such as the resonant inductor L (401) and the direct-current blocking capacitor $C_I$ (403), a radio-frequency analog signal may be generated.

The first input end B(i) and the second input end R(i) of each amplifying unit are connected to corresponding digital bits. A capacitance value of the energy returning capacitor of each amplifying unit is corresponding to a relative position of a corresponding input bit in all bits. For example, a digital signal input to the power amplifier is (0,0,1), which has three bits Bit2[MSB], Bit1, and Bit0[LSB], and the energy returning capacitors of three amplifying units (410, 411, 412) corresponding to the input digital signal are $2^0$ C, $2^1$C, and $2^2$C, respectively. C is a basic capacity, and the value of C is dependent upon a carrier frequency of the transmitter and a value of the resonant inductor 401, and may be a function using the carrier frequency F of the transmitter, the value L of the resonant inductor, and the total number N of amplifying units coupled in parallel as parameters: C=f(F,L,N). For example, C is inversely proportional to a product of F, L and $2^N$. A specific example is as follows: $C=1/(4*PI*PI*F*F*L*2^N)$, where in the equation, PI represents the circular constant, F represents the carrier frequency of the transmitter, L is the value of the resonant inductor in the power amplifier circuit, and N represents the total number of energy returning power amplifiers.

The working principle of the power amplifier shown in FIG. 4 is described below through embodiments.

Figure 5:
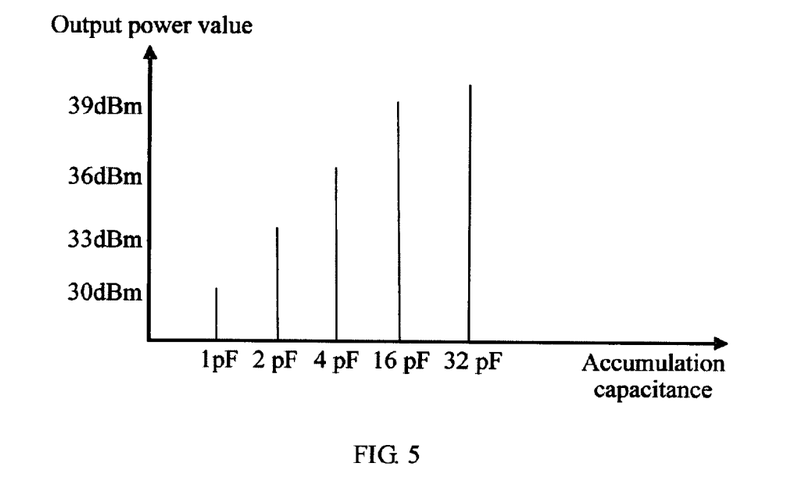
FIG. 5 is a diagram showing an example of an increasing function relationship between an output power of a power amplifier and an accumulated capacitance value.

B(0) to B(n) are directly controlled by a binary digital switching signal representing a signal amplitude. The digital switching signal from an LSB to an MSB is corresponding to B(0) to B(n), respectively, that is, each bit from the LSB to the MSB is corresponding to one B(i), and signals of R(0) to R(n) are inverted signals of signals of B(0) to B(n). VR(i) is a low-voltage power input, and is configured to charge the energy returning capacitor xC in the amplifying unit to an expected voltage $V_L$ through the diode in the amplifying unit, so as to ensure the accuracy of a working direct-current reference of the transistor T1. When a certain bit B(i) is a high level (for example, B(i)=1), the second transistor T2 (or referred to as an energy returning transistor) of the amplifying unit corresponding to the bit is off, the first transistor T1 (or referred to as a power amplifier transistor) is on, and the energy returning capacitor xC is on, where $x=2^i$. All the energy returning capacitors of the amplifying units corresponding to high-level bits form an accumulative relationship, so that theoretically, the whole power amplifier circuit may obtain through combination any capacitance value ranging from C to $2^n$ C with the basic capacitance C as a step. An output power of the power amplifier is in an increasing function relationship with a capacitance value obtained through accumulation, and reference may be made to an example in FIG. 5. When all B(i) are low level (for example, all B(i)=0), the second transistors T2 (or referred to as an energy returning transistor) of all the amplifying units are turned on, and each amplifying unit outputs excess energy to the power input $V_L$ through the third input end VR(i) (VR(0), VR(1), . . . , VR(n)), so as to form an output envelope required for information transport. Theoretically, a signal after baseband modulation has an envelope, and for recovery of the actual signal, the output envelope is required. The envelope is formed through the returned energy in the embodiment of the present application. Otherwise, the radio-frequency signal that is output by the switching signal only but has no envelope cannot carry information. To ensure a dynamic range, it needs to be ensured that $V_H>>V_L$. For example, it may be set that $V_H=29$ V, and $V_L=1$ V.

The power amplifier shown in FIG. 4 does not perform power superimposition in a manner of power combination, but changes circuit impedance by controlling the parallel capacitance value through a switching digital signal (input baseband signal), thereby controlling a returned power value and forming different output powers. The problem of power loss and low efficiency caused by the power combination manner can be effectively resolved.

Figure 6:
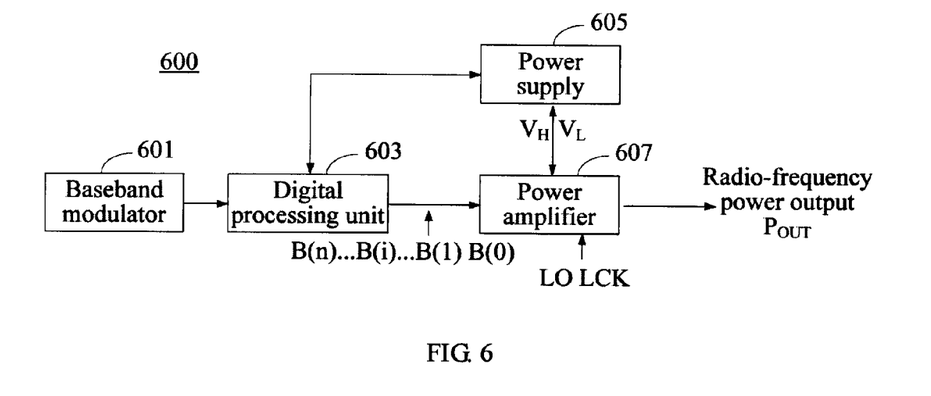
FIG. 6 is a schematic structural diagram of a transmitter according to an embodiment of the present application.

FIG. 6 is a schematic structural diagram of a transmitter according to an embodiment of the present application.

The transmitter 600 shown in the figure includes a baseband modulation unit 601, a digital processing unit 603, a power supply unit 605 and a power amplifier 607. The DAC and analog up conversion part in the transmitter may be absent here. A signal processed by the baseband modulation unit 601 is processed by the digital processing unit 603, and converted to a digital switching signal group that has a signal symbol rate being the carrier frequency of the transmitter and a central frequency of a first harmonic of the signal spectrum being the carrier frequency of the transmitter, and then sent to the power amplifier 607. The power amplifier 607 completes direct radio-frequency power output after signal amplification and digital/analog conversion. For the power amplifier 607, reference may be made to the embodiment of the power amplifier shown in FIG. 4. It outputs, according to the input digital signal, a radio-frequency power signal meeting requirements, that is, the output radio-frequency power signal is consistent with an analog signal that the input digital signal intends to express. Excess energy is returned to the power supply unit 605 for reuse in a next power supply switching period, rather than converted to heat energy, and thereby the working efficiency of the transmitter is greatly improved. The returned energy may also be used to form an envelope. If a target signal expressed by the digital signal does not require full amplitude output at a certain moment, the energy difference between the full amplitude signal and the target signal is the excess energy. The returning process occurs when all B(i) are the low level. The digital processing unit is responsible for calculating, according to the expected signal amplitude value expressed by the baseband signal, a magnitude of the energy returned to the power supply unit, and sampling an output of the power supply unit to calculate a power supply duty ratio of each working period. As such, the stability of the power supply output voltage ($V_H$, $V_L$) can be ensured, so that the power supply unit does not fluctuate beyond the range due to the received energy returned by the power amplifier. A specific method for the value of energy returned to the power supply unit may be a calculation method which may not be limited in the embodiment of the present application.

In another embodiment of the present application, the transmitter 600 may include the digital processing unit 603, the power supply unit 605 and the power amplifier 607. The baseband modulation unit 601 is placed in another network element entity, and the another network element entity may be coupled to the transmitter 600 in a manner of an optical fiber, a cable or a microwave, which may not be limited in the embodiment of the present application.

Optionally, the transmitter provides a clock signal LO CLK to the power amplifier 607, and the clock signal modulates the digital baseband signal by using an "AND" relationship. A frequency of the clock signal is the carrier frequency of the transmitter. The clock signal is coupled to all the amplifying units in the power amplifier.

Figure 7:
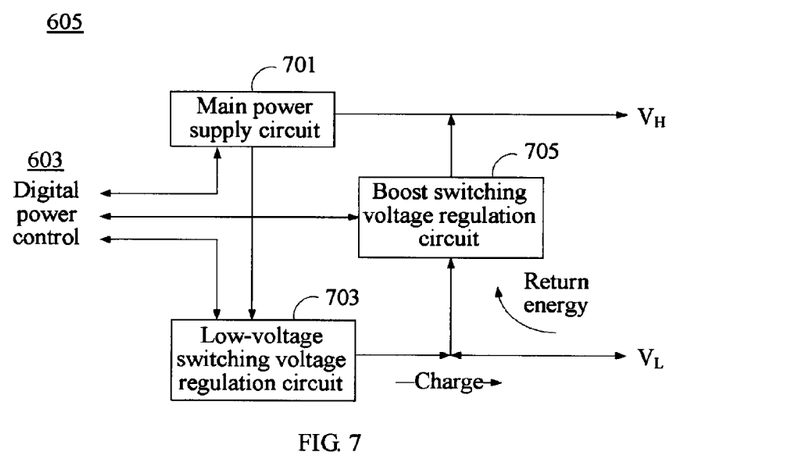
FIG. 7 is a schematic diagram of an embodiment of a power supply unit in the transmitter shown in FIG. 6.

FIG. 7 is a schematic diagram of an embodiment of the power supply unit 605 in the transmitter shown in FIG. 6. In this embodiment, the power supply unit 605 includes a main power supply circuit 701, a low-voltage switching voltage regulation circuit 703 and a boost switching voltage regulation circuit 705. The main power supply circuit 701 is coupled to the low-voltage switching voltage regulation circuit, and configured to supply power to the low-voltage switching voltage regulation circuit, and output $V_H$. The low-voltage switching voltage regulation circuit 703 is further configured to output $V_L$, so as to charge the energy returning capacitor of the amplifying unit in the power amplifier. The boost switching voltage regulation circuit 705 is coupled to the power inputs $V_H$ and $V_L$, and configured to boost $V_L$ to $V_H$. The digital processing unit 603 in the transmitter shown in FIG. 6 is coupled to the main power supply circuit 701, the low-voltage switching voltage regulation circuit 703 and the boost switching voltage regulation circuit 705, and configured to perform digital power control for the power supply unit 605, so as to control fluctuation of the power input $V_L$. The digital power control function includes: calculating a switching transistor duty ratio of each power supply circuit (701, 703, 705) in a current working period based on a preset algorithm according to the returned power value of a previous working period and a sampled working voltage of each power supply circuit (701, 703, 705) in the current working period. The preset algorithm aims to keep $V_L$ as accurate as possible, that is, keep the value of $V_L$ in a preset value range unchanged as far as possible. To keep $V_L$ accurate, the main power supply circuit is preferably used for supplying power, and the boost switching voltage regulation circuit and the low-voltage switching voltage regulation circuit are stopped from supplying energy as far as possible. As the efficiency of the operation of bucking the main power supply voltage and then boosting $V_L$ is lower than that of directly converting the main power supply voltage to a working voltage of the power amplifier; therefore, if it is detected that the voltage of $V_L$ is a rated value within a certain period, switching transistors of the boost switching voltage regulation circuit and the low-voltage switching voltage regulation circuit may be kept in an off state, that is, the duty ratio is 0. The power amplifier is completely powered by the power amplifier. Once it is detected that $V_L$ increases, the duty ratio of the boost switching voltage regulation circuit may be calculated in a next switching period according to the amount of energy that needs to be sent out to lower the voltage of $V_L$ to the rated value, and the energy value is subtracted for calculation of the duty ratio of the main power supply circuit, so that $V_L$ returns to the rated value after the switching period.

Figure 8:
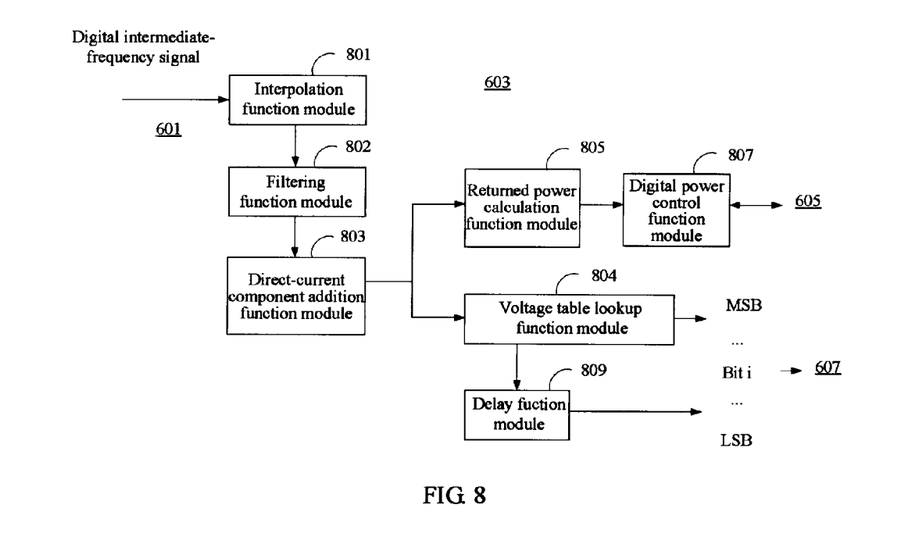
FIG. 8 is a schematic diagram of an embodiment of a digital processing unit in the transmitter shown in FIG. 6.

FIG. 8 is a schematic diagram of an embodiment of the digital processing unit 603 in the transmitter shown in FIG. 6. Function modules included by the digital processing unit 603 are described below.

An interpolation function module 801 is configured to increase a signal rate of an input digital intermediate-frequency signal to a frequency of an LO CLK through a preset interpolation algorithm.

The LO CLK is a clock signal provided to the transmitter. The clock signal modulates a digital baseband signal by using an "AND" relationship, so that the digital baseband signal moves to the frequency of the LO CLK. That is, the digital signal having a symbol rate equal to the target carrier frequency of the transmitter becomes a switching signal group having a central frequency being the carrier frequency, after being modulated using the "AND" relationship. That is, the central frequency of each signal in the signal group B(0)-B(n) is the carrier frequency. A frequency of the clock signal is the carrier frequency of the transmitter.

In addition, the clock signal may further be coupled to all the amplifying units in the power amplifier.

A filtering function module 802 is configured to filter off a noise component generated by the interpolation operation. The function module is an optional function module.

A direct-current component addition function module 803 is configured to add a direct-current component having an amplitude equal to ½ of the complete digital dynamic range to the signal after the interpolation operation or filtering operation, so as to convert the input signal amplitude to a positive value.

A voltage table lookup function module 804 is configured to obtain, through table lookup according to the input signal amplitude value after direct-current component addition, a capacitance value that is represented by binary bits and uses a capacitance value C as a basic unit, and output the table lookup capacitance value represented by binary bits. For example, if it is intended to output a sample point having an amplitude of 30 dBm in a certain sample period, a corresponding capacitance value obtained through voltage table lookup is 25 C, and outputs of B(4) to B(0) in the sample period are 11001 in sequence. The table may be obtained through measurement and calibration.

A delay function module 809 is configured to delay a plurality of symbol periods, and compensate for voltage table lookup time. The function module is an optional module. When the function module is adopted, outputs of the voltage table lookup function module 804 and the delay function module 809 jointly form bits from an MSB to an LSB input to the power amplifier 607.

Optionally, the output of the delay function module 809 forms several low bits that start from the LSB and are input to the power amplifier 607, and is configured to drive a low-power signal power amplifier. Here, the number of the several low bits is the same as that of low-power signal power amplifiers. Such a low-power signal power amplifier may be a linear power amplifier transistor working in a pure B state, and may not require table lookup correction due to its good linearity. To finally enable the signals output by all bits to appear at the output end in the same time, bits that do not require table lookup correction needs to be delayed, where the delayed time is the same as the periods taken for table lookup correction. The LO CLK clock signal may further be coupled to all the low-power power amplifiers.

Optionally, low-power power amplifier driver may be further connected to the low-power signal power amplifier, so as to drive the low-power signal power amplifier. Accordingly, the LO CLK clock signal may be coupled to all the low-power power amplifier drivers, and thereby coupled to all the low-power signal power amplifiers.

A returned power calculation function module 805 calculates a value of power that is accumulatively returned in a current switching period, and output the obtained returned power value before a next switching period begins.

A digital power control function module 807 is configured to calculate a switching transistor duty ratio of each power supply circuit (701, 703, 705) in a current working period according to a preset algorithm, according to the returned power value of a previous working period input by the returned power calculation module and a sampled working voltage of each power supply circuit (701, 703, 705) in the current working period. For the preset algorithm, reference may be made to the relevant description of the embodiment shown in FIG. 7.

The embodiments of the transmitter of the present application have the following technical advantages.

As all the amplifying units in the power amplifier work in an on/off state, a high efficiency of the power amplifier may be obtained at a high power, and theoretically the efficiency of the power amplifier may reach 100%, which thereby greatly improves the working efficiency of the entire transmitter.

Theoretically, no distortion occurs in the final output of the transmitter, so that high signal modulation quality (EVM) is obtained.

Compared with a common single-transistor power amplifier or a Doherty Class E power amplifier, the power amplifier of the embodiments of the present application have a structure similar to the switching power amplifier, so that the output of the transmitter is highly linear, and theoretically no linearization technology is required to improve the linearity, which may save the cost of a digital pre-distortion (DPD) circuit.

As all other circuits in the transmitter channels than the power amplifier which is an analog circuit may be digital circuits, the structure of the entire transmitter is simple and highly reliable, which avoids spuriousness and noise caused by introduction of the mixing structure; and further, heat dissipation and the volume of the transmitter are reduced.

As the output signal does not adopt a mixing manner, no noise signal such as local oscillation and inter-modulation component exists, and therefore, theoretically no post-stage filter is required. Theoretically, the working frequency is not limited, and a platform ultra-wideband transmitter having a multiplied frequency may be implemented, so as to effectively support a multi-mode and multi-carrier base station.

The dependence on high-speed DAC devices can be eliminated, which greatly reduces the risk of product supply.

The period of design can be greatly shortened, transmission channel link estimation is not required, and only power amplification matching and power need to be calculated.

The above specific embodiments describe in further detail the objectives, technical solutions and beneficial effects of the present application. It should be understood that the above descriptions are merely specific embodiments of the present application, but not intended to limit the protection scope of the present application. Any modification, equivalent replacement, or improvement made without departing from the spirit and principle of the present application should fall within the protection scope of the present application.

More Embodiments

1. An amplifying unit, including a first input end B(i), a second input end R(i), a third input end VR(i) and an output end D(i), where a signal input to the second input end R(i) is an inverted signal of a signal input to the first input end B(i), the amplifying unit further including:

a first transistor T1, having a grid electrode coupled to the first input end B(i), a drain electrode coupled to the output end D(i), and a source electrode coupled to an energy returning capacitor xC, where the energy returning capacitor xC has one end coupled to the source electrode of the first transistor T1 and another end grounded; and a second transistor T2, having a grid electrode coupled to the second input end R(i), a source electrode coupled to the third input end VR(i) and an anode of a diode, and a drain electrode coupled to the source electrode of the first transistor T1 and a cathode of the diode.

2. The amplifying unit according to Embodiment 1, where the signal input to the first input end B(i) is a binary digital switching signal.

3. The amplifying unit according to Embodiment 1, where x of the energy returning capacitor xC is a positive integer for representing that a capacitance value of the energy returning capacitor is a positive integral multiple of a capacitor capacity C.

4. The amplifying unit according to Embodiment 1, where the third input end VR(i) is configured to receive a power input, and charge the energy returning capacitor xC through the diode.

5. The amplifying unit according to Embodiment 1, where both the first transistor T1 and the second transistor T2 work in an on/off state.

6. The amplifying unit according to Embodiment 1, where an output of the output end D(i) is a radio-frequency switching signal.

7. A power amplifier, including n+1 amplifying units which are according to any one of Embodiments 1 to 6 and coupled in parallel, where n is an integer greater than or equal to 0, the third input ends VR(i) of the n+1 amplifying units are coupled to a power input $V_L$, the output ends D(i) of the n+1 amplifying units are coupled to a power input $V_H$, and an output power of the power amplifier is in an increasing function relationship with a capacitance value obtained through accumulation of the energy returning capacitors xC of the n+1 amplifying units.

8. The power amplifier according to Embodiment 7, where the parallel coupling is that: the third input ends VR(i) of the n+1 amplifying units are all coupled to the power input $V_L$, and the output ends D(i) of the n+1 amplifying units are all coupled to the power input $V_H$ and an output end $P_{OUT}$ of the power amplifier.

9. The power amplifier according to Embodiment 7, further including a capacitor $C_B$, where the third input ends VR(i) of the n+1 amplifying units and the power input $V_L$ are grounded through the capacitor $C_B$, and the capacitor $C_B$ is configured to absorb an energy returned by the n+1 amplifying units.

10. The power amplifier according to Embodiment 7, further including a resonant inductor L and a direct-current blocking capacitor $C_I$, where the output ends D(i) of the n+1 amplifying units are coupled to the power input $V_H$ through the resonant inductor L, and the output ends D(i) of the n+1 amplifying units are coupled to an output end $P_{our}$ of the power amplifier through the direct-current blocking capacitor $C_I$.

11. The power amplifier according to Embodiment 7, where the first input end B(i) of each amplifying unit in the n+1 amplifying units is corresponding to an $i^{th}$ bit from an LSB to an MSB in n+1 digital bits input to the power amplifier.

12. The power amplifier according to Embodiment 7, where a value of the energy returning capacitor xC of any amplifying unit in the n+1 amplifying units is corresponding to a relative position of a bit corresponding to the amplifying unit in n+1 digital bits input to the power amplifier.

13. A transmitter, including a digital processing unit and a power supply unit, the transmitter further including the power amplifier according to any one of Embodiments 7 to 12, where the power supply unit is coupled to the digital processing unit and the power amplifier, the power amplifier is configured to receive a digital signal input by the digital processing unit, perform signal amplification, output a radio-frequency signal after performing digital/analog conversion on the amplified signal, and output a returned energy to the power supply unit.

14. The transmitter according to Embodiment 13, where the digital processing unit is configured to receive a digital baseband signal, and a symbol rate of an output signal is equal to a carrier frequency of the transmitter.

15. The transmitter according to Embodiment 13, where the digital processing unit is configured to calculate a value of the returned energy.

16. The transmitter according to Embodiment 13, where the digital processing unit is configured to perform digital power control for the power supply unit, so as to control fluctuation of a power input $V_L$.

17. The transmitter according to Embodiment 13, where the transmitter further includes a baseband modulation unit coupled to the digital processing unit.

18. The transmitter according to Embodiment 13, where the transmitter further includes a clock signal LO CLK coupled to the n+1 amplifying units in the power amplifier, and a frequency of the clock signal LO CLK is equal to a carrier frequency of the transmitter.

19. The transmitter according to Embodiment 13, where the power supply unit includes a main power supply circuit, a low-voltage switching voltage regulation circuit and a boost switching voltage regulation circuit;

the main power supply circuit is coupled to the low-voltage switching voltage regulation circuit, and configured to supply power to the low-voltage switching voltage regulation circuit, and output $V_H$;

the low-voltage switching voltage regulation circuit is configured to output $V_L$; and the boost switching voltage regulation circuit is coupled to the power inputs $V_H$ and $V_L$ of the power amplifier, and configured to boost $V_L$ to $V_H$.

20. The transmitter according to Embodiment 13, where the digital processing unit includes:

an interpolation function module, configured to increase a signal rate of the input digital signal through a preset interpolation algorithm;

a direct-current component addition function module, coupled to the interpolation function module, and configured to convert an amplitude of the signal processed by the interpolation function module to a positive value;

a returned power calculation function module, coupled to the direct-current component addition function module, and configured to calculate a value of power that is accumulatively returned in a current switching period, and output the obtained returned power value before a next switching period begins;

a digital power control function module, coupled to the returned power calculation function module, and configured to calculate a switching transistor duty ratio of each power supply circuit in a current working period according to a preset algorithm, according to the returned power value and a sampled working voltage of each power supply circuit in the current working period; and a voltage table lookup function module, coupled to the direct-current component addition function module, and configured to obtain, through table lookup according to the input signal amplitude value after direct-current component addition, a capacitance value that is represented by binary bits and uses a capacitance value C as a basic unit, output the table lookup capacitance value represented by binary bits, and input the table lookup capacitance value to the power amplifier as the digital signal input to the power amplifier.

21. The transmitter according to Embodiment 20, where the digital processing unit further includes:

a filtering function module 802, coupled to the interpolation function module and the direct-current component addition function module, and configured to filter off a noise component generated by the interpolation operation, where the direct-current component addition function module is connected to the interpolation function module through the filtering function module.

22. The transmitter according to Embodiment 20, where the digital processing unit further includes:

a delay function module, configured to delay a plurality of symbol periods, and compensate for voltage table lookup time; and outputs of the voltage table lookup function module and the delay function module jointly form bits that are from an MSB to an LSB and input to the power amplifier.

23. The transmitter according to Embodiment 22, where the output of the delay function module forms a low bit input to the power amplifier, and is configured to drive a low-power signal power amplifier.

What is claimed is:

1. An amplifying unit, comprising: a first input end B(i), a second input end R(i), a third input end VR(i) and an output end D(i), wherein a signal input to the second input end R(i) is an inverted signal of a signal input to the first input end B(i), wherein the amplifying unit further comprises:

a first transistor T1, having a grid electrode coupled to the first input end B(i), a drain electrode coupled to the output end D(i), and a source electrode coupled to an energy returning capacitor xC, wherein the energy returning capacitor xC has one end coupled to the source electrode of the first transistor T1 and another end grounded; and a second transistor T2, having a grid electrode coupled to the second input end R(i), a source electrode coupled to the third input end VR(i) and an anode of a diode, and a drain electrode coupled to the source electrode of the first transistor T1 and a cathode of the diode.

2. The amplifying unit according to claim 1, wherein the third input end VR(i) is configured to receive a power input, and charge the energy returning capacitor xC through the diode.

3. A power amplifier, comprising n+1 amplifying units according to claim 1 coupled in parallel, wherein n is an integer greater than or equal to 0, the third input ends VR(i) of the n+1 amplifying units are coupled to a power input $V_L$, the output ends D(i) of the n+1 amplifying units are coupled to a power input $V_H$, and an output power of the power amplifier is in an increasing function relationship with a capacitance value obtained through accumulation of the energy returning capacitors xC of the n+1 amplifying units.

4. The power amplifier according to claim 3, wherein the parallel coupling is that: the third input ends VR(i) of the n+1 amplifying units are coupled to the power input $V_L$, and the output ends D(i) of the n+1 amplifying units are coupled to the power input $V_H$ and an output end $P_{OUT}$ of the power amplifier.

5. The power amplifier according to claim 3, further comprising a capacitor $C_B$, wherein the third input ends VR(i) of the n+1 amplifying units and the power input $V_L$ are grounded through the capacitor $C_B$, and the capacitor $C_B$ is configured to absorb an energy returned by the n+1 amplifying units.

6. The power amplifier according to claim 3, further comprising a resonant inductor L and a direct-current blocking capacitor $C_I$, wherein the output ends D(i) of the n+1 amplifying units are coupled to the power input $V_H$ through the resonant inductor L, and the output ends D(i) of the n+1 amplifying units are coupled to an output end $P_{OUT}$ of the power amplifier through the direct-current blocking capacitor $C_I$.

7. The power amplifier according to claim 3, wherein the first input end B(i) of each amplifying unit in the n+1 amplifying units is corresponding to an $i^{th}$ bit from an LSB to an MSB in n+1 digital bits input to the power amplifier.

8. The power amplifier according to claim 3, wherein a value of the energy returning capacitor xC of any amplifying unit in the n+1 amplifying units is corresponding to a relative position of a bit corresponding to the amplifying unit in n+1 digital bits input to the power amplifier.

9. A transmitter, comprising a digital processing unit and a power supply unit, wherein the transmitter further comprises an power amplifier according to claim 3, and the power supply unit is coupled to the digital processing unit and the power amplifier, the power amplifier is configured to receive a digital signal input by the digital processing unit, perform signal amplification, output a radio-frequency signal after performing digital/analog conversion on the amplified signal, and output a returned energy to the power supply unit.

10. The transmitter according to claim 9, wherein the digital processing unit comprises:
- an interpolation function module, configured to increase a signal rate of an input digital signal through a preset interpolation algorithm;
- a direct-current component addition function module, coupled to the interpolation function module, and configured to convert an amplitude of the signal processed by the interpolation function module to a positive value;
- a returned power calculation function module, coupled to the direct-current component addition function module, and configured to calculate a power value accumulatively returned in a current switching period, and output the obtained returned power value before a next switching period begins;
- a digital power control function module, coupled to the returned power calculation function module, and configured to calculate a switching transistor duty ratio of each power supply circuit in a current working period according to a preset algorithm, according to the returned power value and a sampled working voltage of each power supply circuit in the current working period; and
- a voltage table lookup function module, coupled to the direct-current component addition function module, and configured to obtain, through table lookup according to the input signal amplitude value after direct-current component addition, a capacitance value that is represented by binary bits and uses a capacitance value C as a basic unit, output the table lookup capacitance value represented by binary bits, and input the table lookup capacitance value to the power amplifier as the digital signal input to the power amplifier.

* * * * *